(12) United States Patent
Deppe

(10) Patent No.: US 9,236,705 B2
(45) Date of Patent: Jan. 12, 2016

(54) SEPARATELY CONTROLLABLE ARRAY OF RADIATION ELEMENTS

(71) Applicant: KONINKLIJKE PHILIPS N.V., Eindhoven (NL)

(72) Inventor: Carsten Deppe, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/395,525

(22) PCT Filed: Apr. 11, 2013

(86) PCT No.: PCT/IB2013/052869
§ 371 (c)(1),
(2) Date: Oct. 20, 2014

(87) PCT Pub. No.: WO2013/160787
PCT Pub. Date: Oct. 31, 2013

(65) Prior Publication Data
US 2015/0085887 A1    Mar. 26, 2015

Related U.S. Application Data

(60) Provisional application No. 61/636,820, filed on Apr. 23, 2012.

(51) Int. Cl.
*H01S 5/026* (2006.01)
*H05B 33/08* (2006.01)

(52) U.S. Cl.
CPC ............ *H01S 5/026* (2013.01); *H05B 33/0803* (2013.01); *H05B 33/083* (2013.01)

(58) Field of Classification Search
CPC ... H01S 5/026; H05B 33/083; H05B 33/0803
USPC ........................................................ 372/38.03
See application file for complete search history.

(56) References Cited

U.S. PATENT DOCUMENTS

| | | |
|---|---|---|
| 5,337,074 A | 8/1994 | Thornton |
| 5,459,328 A | 10/1995 | Kadota et al. |
| 5,568,498 A | 10/1996 | Nilsson |
| 6,288,696 B1 | 9/2001 | Holloman |
| 6,891,142 B2 | 5/2005 | Ogawa |
| 7,711,021 B2 | 5/2010 | Nishiyama |
| 8,121,161 B2 | 2/2012 | Tanaka |

(Continued)

FOREIGN PATENT DOCUMENTS

| | | |
|---|---|---|
| JP | 04161984 A | 6/1992 |
| JP | 2003282937 A | 10/2003 |

(Continued)

*Primary Examiner* — Tuan Nguyen

(57) ABSTRACT

A good way to avoid extreme current levels when supplying large amounts of power is to increase the voltage. The easiest way to do this is connecting the radiation elements (e.g. laser diode pixels) in series (La1 to La-n). In such a pixelated driver, the amount of components and complexity per pixel are reduced by connecting as many radiation elements as possible in series, supplying the string by one current controlled driver (Is), shortening pixels which should be in off state by a switch in parallel (40-1 to 40-*n*) to the radiation element, storing binary on/off information (30-1 to 30-*n*) for each pixel locally, creating a floating supply (20-1 to 20-*n*) for the switches, and managing information transfer to the floating storage and switches.

15 Claims, 5 Drawing Sheets

(56) References Cited

U.S. PATENT DOCUMENTS

2010/0091807 A1* 4/2010 Deppe et al. ............... 372/38.04
2012/0126714 A1* 5/2012 Deppe et al. ................. 315/192
2013/0221861 A1* 8/2013 Creusen et al. ............... 315/193

FOREIGN PATENT DOCUMENTS

| JP | 2005310997 A | 11/2005 |
|---|---|---|
| WO | 2008129504 A1 | 10/2008 |
| WO | 2009127065 A1 | 10/2009 |

* cited by examiner

SEPARATELY CONTROLLABLE ARRAY OF RADIATION ELEMENTS

CROSS-REFERENCE TO PRIOR APPLICATIONS

This application is the U.S. National Phase application under 35 U.S.C. §371 of International Application No. PCT/IB2013/052869, filed on Apr. 11, 2013, which claims the benefit of U.S. Patent Application No. 61/636,820, filed on Apr. 23, 2012. These applications are hereby incorporated by reference herein.

FIELD OF THE INVENTION

The invention relates to a method and a circuit for driving an array of radiation elements, such as laser diodes or light emitting diodes.

BACKGROUND OF THE INVENTION

In many printing and processing applications lasers or laser diodes are used to heat or illuminate a target using a scanning and modulated beam. The beam is scanned in two dimensions while the power is modulated at high frequency to achieve the required patterns on the target.

As an example, a vertical-cavity surface-emitting laser (VCSEL) is a type of semiconductor laser diode with laser beam emission perpendicular to the top surface, contrary to conventional edge-emitting semiconductor lasers (or in-plane lasers) which emit from surfaces formed by cleaving the individual chip out of a wafer.

Application of VCSEL technology allows a new approach to increase the total speed while even reducing the costs of the laser source. As an example, a line of separately controlled pixels can be built, while scanning is done in one dimension only, similar to the scanning process used in document flatbed scanners. Such pixelated sources have been implemented and next steps are to increase size and power according to desired requirements.

However, when using such concept to full extend, a large number of separately controlled VCSELs is required. At the same time, increasing operation speed also means that total power of each laser diode needs to remain very high. As an example, if a pitch of 100 µm and a current level of 0.5 A at 2V are required for each pixel, this adds up to 1500 A of total current for 30 cm of line length. The sheer number and diameter of such wiring would make the solution impossible to be built. Conventional approaches to solve this problem suggest using multiplexed wiring, e.g., 55 positive and 55 negative connections for the 3000 pixels. For such a solution the on time of one pixel is limited to 1/55 of the time and the current during this time is 55 times the average. It can easily be seen that such an extreme pulsing is not within the capabilities of VCSEL chips and that also here the wiring of 110 wires at a current of 27.5 A is still demanding a lot of diameter.

In display solutions a local transistor adds a separate control to each pixel. In that way only the control status signal needs to go separately (or by serial or multiplexed ways) to each pixel and power is applied globally. Still also this solution can not easily be scaled to the high power density used in VCSEL arrays.

SUMMARY OF THE INVENTION

An object of the present invention is to provide a method and apparatus for controlling a VCSEL array or an array of other types of radiation elements, by means of which an array with high power density and/or high operation speed is enabled.

This object is achieved by a circuit as claimed in claim 1, by a method as claimed in claim 14, and by a computer program product as claimed in claim 15.

Accordingly, large amounts of power can be achieved by connecting the pixels in series so as to increase the total voltage. A pixel string of the array can be supplied by one current controlled driver, while pixels which should be in off state are shorted by a switch connected in parallel to the respective radiation element. Moreover, binary on/off information for each pixel is stored locally and a floating supply for individual switches is created, so that information transfer to the floating storage and switches can be managed individually to achieve an effective implementation of the circuitry. Thereby, the amount of components and complexity per pixel of the proposed pixelated driver can be reduced to the absolute minimum, so that high power density and high operation speed can be achieved.

According to a first aspect, the local storage element and the local floating supply element may be implemented by a capacitor. This provides a simple solution to information storing and local power supply.

According to a second aspect which can be combined with the above first aspect, a local control terminal may be provided for controlling a first local circuit to set the binary information of a respective one of the plurality of local storage elements to a predetermined first state. Thereby, each radiation element can be controlled individually and set to the first state (e.g. a power-on state).

According to a third aspect which can be combined with the above first or second aspect, the first local circuit may be adapted to supply a respective one of the plurality of local floating supply elements in response to the local control terminal. Thus, the local control terminal can also be used for individually supplying energy to the local floating supply elements, so as to reduce circuit complexity.

According to a fourth aspect which can be combined with any of the above first to third aspects, a common control terminal may be provided for controlling a second local circuit to reset the binary information of all local storage elements. Thereby, a single control input can be used to reset all radiation elements to the other binary state, i.e. the second state which may be a power-off state.

According to a fifth aspect, which can be combined with any of the above first to fourth aspects, the circuit may be adapted to supply control information to the local or common control terminal during pulse pauses of the array of radiation elements. The pulse pauses may be generated via the common control terminal or by using a current supply.

According to a sixth aspect which can be combined with the above fifth aspect, a plurality of other local storage elements may be provided for storing binary information to be used for determining the switching state of the respective switching elements in a subsequent pulse of the pulsed current supply.

The measures according to the fifth and sixth aspects also serve to provide an efficient realization of transmission and storage with minimum amount of components The circuit according to any one of the above aspects may be provided in an illumination device together with the array of radiation elements which may optionally comprise a string of radiation elements connected in series. Then, a single current source may be used for supplying current to the string of radiation elements and may optionally be adapted to generate a pulsed current supply for the string of radiation elements.

The proposed driving scheme may be implemented as a computer program product stored on a computer-readable medium or downloaded from a network, which comprises code means for producing the steps of method claim 14 when run on a computing device.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings:

FIG. 1 shows a schematic block diagram of a driving circuit according to a first embodiment;

FIG. 2 shows a schematic circuit diagram of a circuit portion for driving a single pixel, according to a second embodiment;

FIG. 3 shows a schematic circuit diagram of a driving circuit built up of a plurality of circuit portions according to the second embodiment;

FIG. 4 shows waveform diagrams for a first operation example with pulsed source;

FIG. 5 shows waveform diagrams for a second operation example with constantly operating source; and FIG. 6 shows a portion of the waveform diagrams of FIG. 5 for the second operation example with increased time resolution.

DETAILED DESCRIPTION OF EMBODIMENTS

Various embodiments of the invention will now be described based on a driving circuit provided for driving an array of laser diodes La1 to La-n, which may be VCSELs, of an illumination device.

Figure 1:
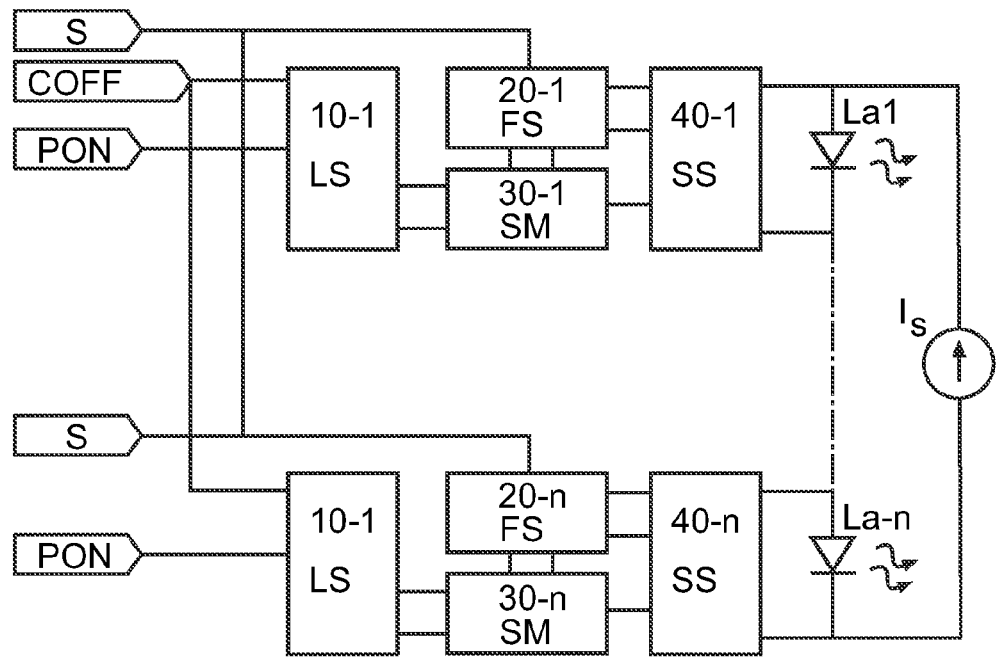

FIG. 1 shows a schematic block diagram of an illumination device with a driving circuit according to a first embodiment. A series connection of a plurality of laser diodes La1 to La-n receives its supply current from a current source Is. Furthermore, the driving circuit consists of n driving stages each supplied from a respective supply terminal S via a floating supply circuit (FS) 20-1 to 20-n. The floating supply circuits 20-1 to 20-n are connected to respective state memories (SM) 30-1 to 30-n into which a binary information can be set or written via respective pixel-on control terminals (PON) via respective level shifting circuits (LS) 10-1 to 10-n. Moreover, a common reset or off control terminal (COFF) is provided for commonly resetting the binary information in each state memory 30-1 to 30-n via the respective level shifting circuits 10-1 to 10-n. The floating supply circuits 20-1 to 20-n and the state memories 30-1 to 30-n are connected to respective switching elements (SS) 40-1 to 40-n adapted to shorten a respective one of the laser diode La1 to La-n, to which is connected in parallel. Thereby, each of the laser diodes La1 to La-n (which form a line of pixels of the illumination device) can be individually switched on via the respective pixel-on control terminal PON an all laser diodes La1 to La-n may be switched off together via the single common-off control terminal. Of course, the illumination device could be modified to perform control in the opposite way, i.e., selective switch off and common switch on.

In the following, one of the n stages of the driving circuit is described in more detail based on a second embodiment shown in FIG. 2.

Figure 2:
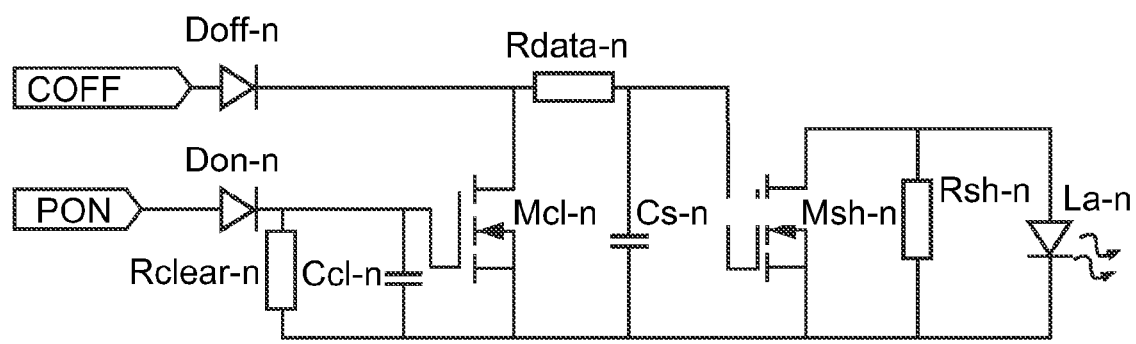

FIG. 2 shows a schematic circuit diagram of one driving or pixel stage n of the driving circuit according to the second embodiment which can be implemented using two metal oxide semiconductor field effect transistors (MOSFETs) Mc1-n and Msh-n for each pixel. The other driving or pixel stages 1 to n−1 may consist of the same or similar circuits.

Figure 3:
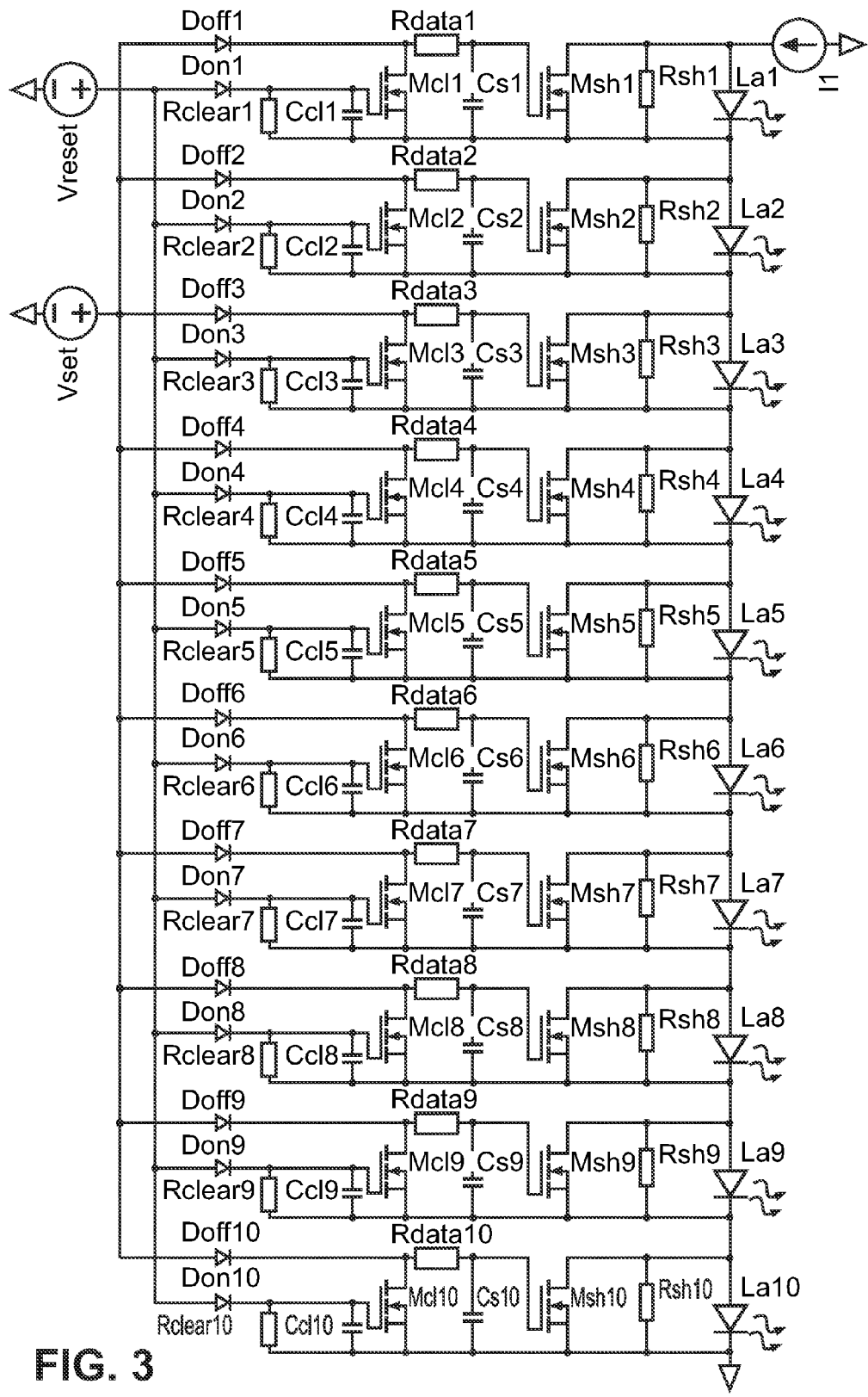

The first transistor Msh-n is used as a short circuit switch for the laser diode La-n and its operating point is set by a first resistor Rsh-n. A first short-term or temporary capacitor Cs at the input of the first transistor Msh-n has the function of a storage element (i.e. the state memory 30-n of FIG. 1) as well as that of delivering the floating supply for the first transistor Msh-n (i.e. floating supply circuit 20-n of FIG. 1). Charge and discharge speed of the first capacitor Cs-n is determined by a second resistor Rdata-n. Activation of the first transistor Msh-n and charging of the first capacitor Cs-n is achieved via a first diode Doff-n applying a common pulse from a pulsed source connected to the common control connector or terminal COFF connection at the end of each laser pulse. The binary information which determines which one of the laser diode La1 to La-n shall be turned on for the next pulse is transmitted via the respective pixel-on connector or terminal PON and a second diode Don-n to a second short-term or temporary storage capacitor Cc1-n. This signal, if applied to the channel or driving stage n, activates the second MOSFET Mc1-n which then clears the signal at the gate of the first transistor Msh and thus activates the respective laser diode LA-n again. Discharge speed of the second capacitor Cc1-n is determined by a third resistor Rclear-n FIG. 3 shows a schematic circuit diagram of a driving circuit built up of a plurality of circuit portions according to the second embodiment, wherein a string of ten laser diodes La1 to La10 is used and wherein all laser diodes (i.e. pixels) La1 to La10 are also turned on by a single control signal, since all pixel-on control terminals are connected to the same pulsed source Vreset, as is also the case for the common terminal at the other pulsed source Vset. If individual pixel-on control was desired, the pulsed source Vreset would have to be separately switchable for each laser diode or pixel.

In a practical embodiment of the invention the current source Is may be a buck converter with low output capacitance and the control signals can be provided by standard logic integrated circuits (ICs) or a microcomputer (μC). For optimal efficiency the current source Is can be switched off during the time of the control pulses at the control terminals PON and COFF.

Figure 4:
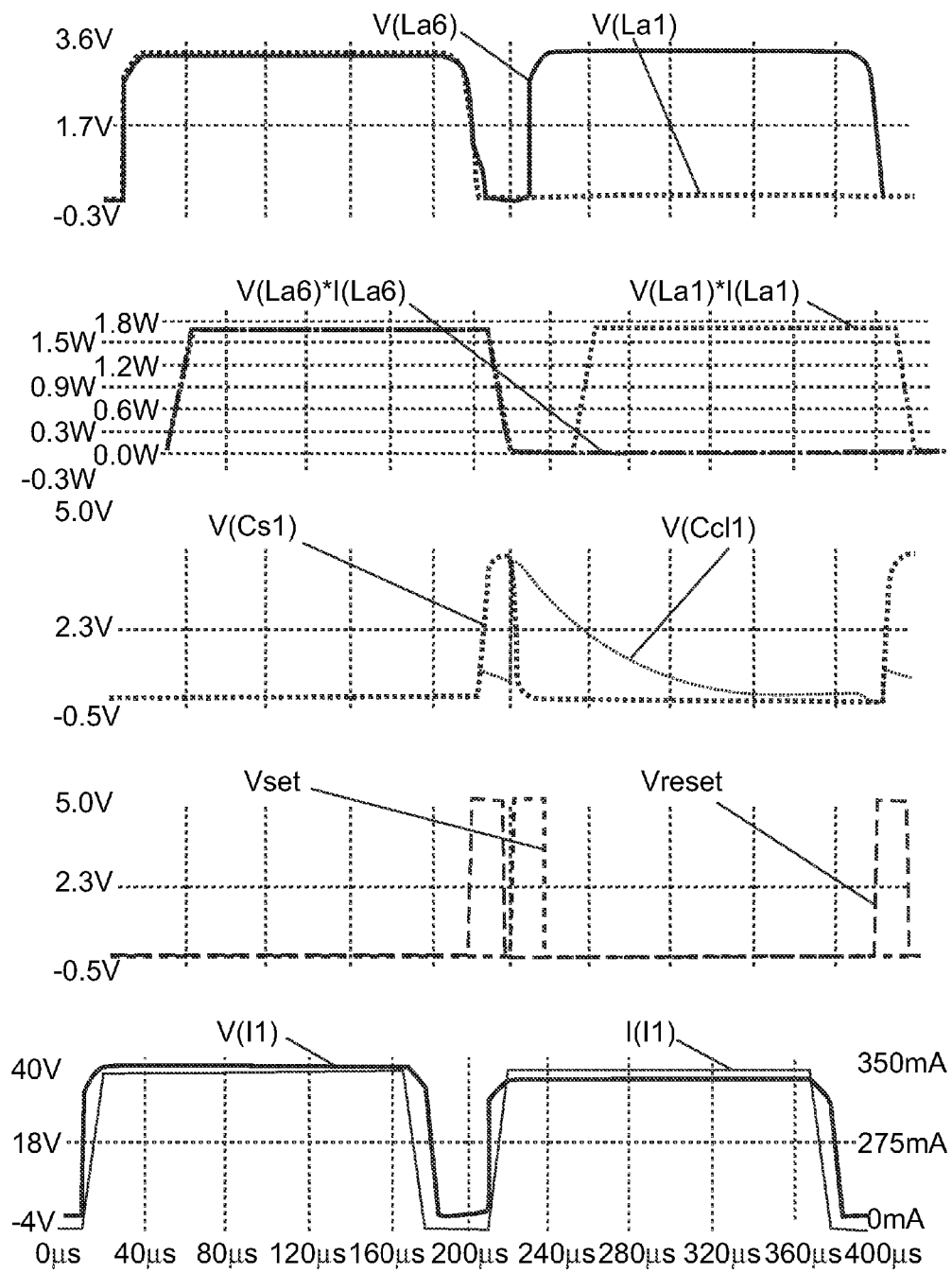
Figure 5:
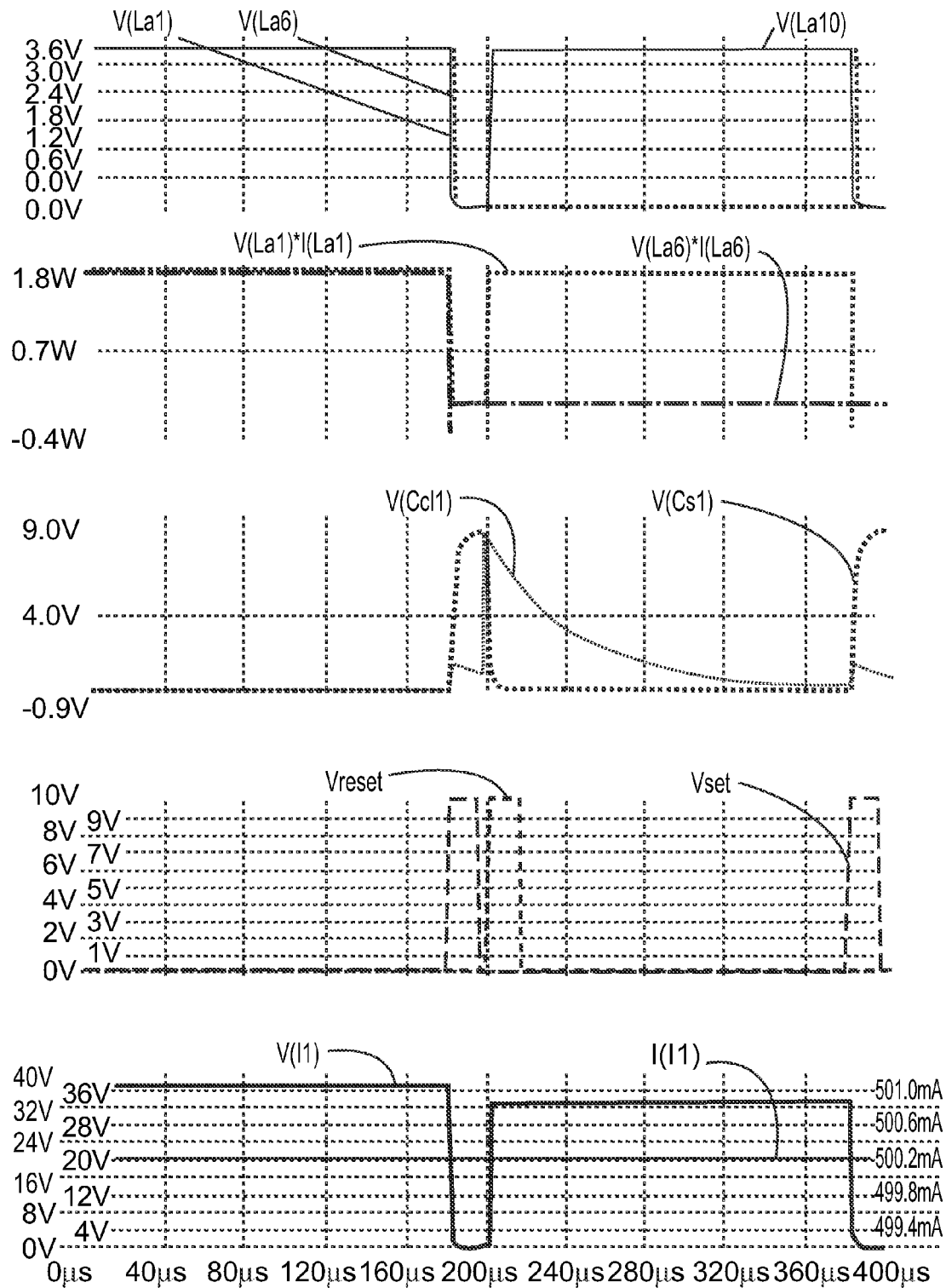
Figure 6:
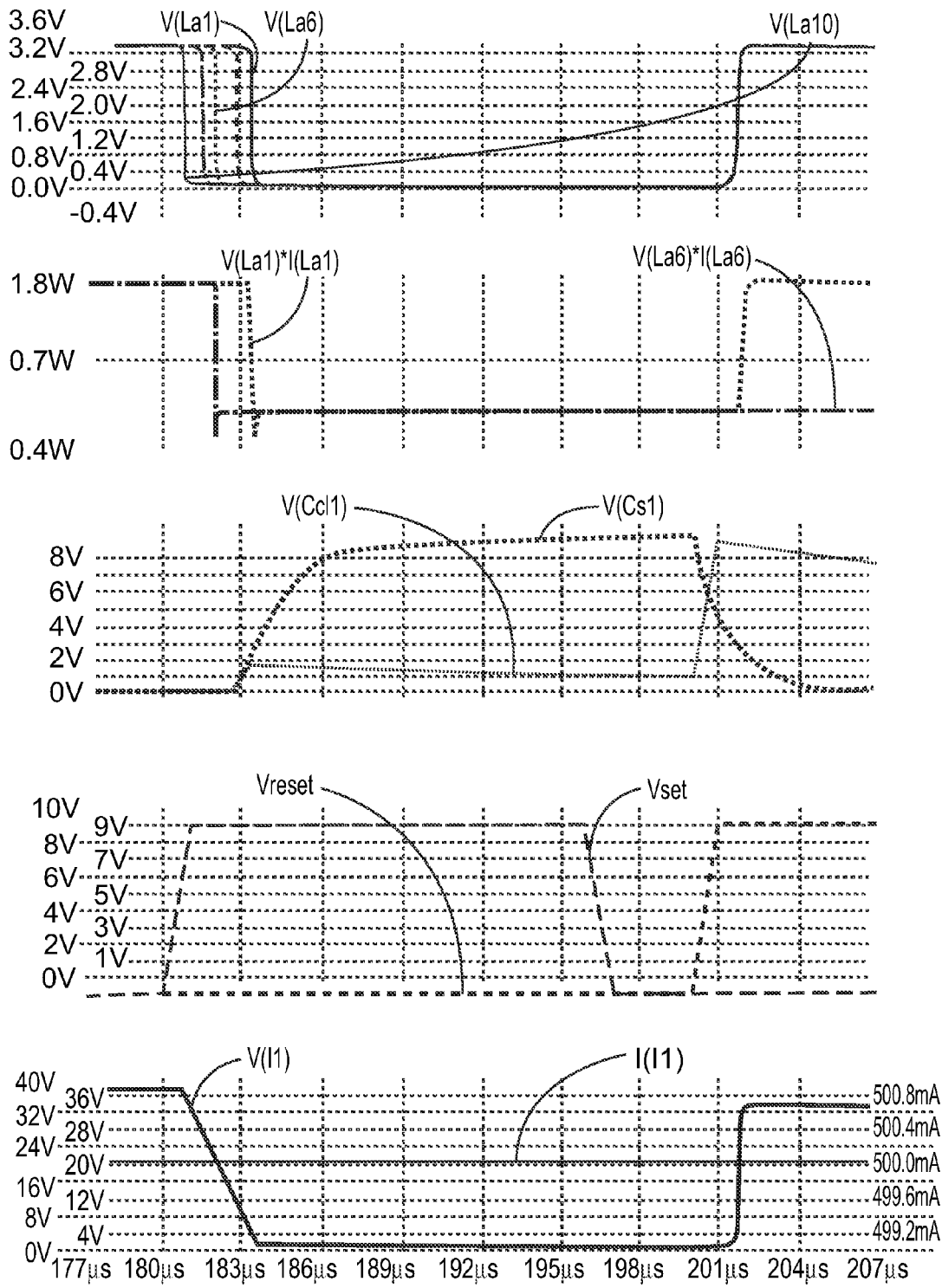

The following FIGS. 4 to 6 show exemplary waveform diagrams of simulation results in a range from 0 to 400 μs of the circuit of FIG. 3 with the difference of selective switch-off control, where during the first pulse, all laser diodes La1 to La10 are switched on, and during the second pulse, only the sixth laser diode La6 is turned off.

In FIG. 4, from top to bottom, the first diagram shows respective voltage waveforms V(La1) and V(La6) of an active laser diode and an inactive laser diode in the second pulse. When the short circuit switch (i.e. first transistor Msh) is active, only a small voltage drop due to the on-resistance Rdson of the drain-source path of this short circuit switch remains.

Furthermore, the second diagram shows power waveforms V(La1)*I(La1) and V(La6)*I(La6) in the first and sixth laser diodes La1 and La6. Due to the low voltage on the short circuit switch there is no power in the inactive Laser.

The third diagram shows voltage waveforms V(Cc11) and V(Cs1) at the gate of the first transistor Msh1 and the second transistor Mc11 of the first stage. Charging and discharging of the first capacitor Cs1 (waveform V(Cs1)) is limited by the second resistor Rdata1). The pulse duration of the other pulsed source Vset is selected to achieve a full charge. To ensure discharge when the pixel (i.e. respective laser diode) has to be activated, the discharge command is also buffered by the second storage capacitor Cell, resulting in the long voltage tail of waveform V(Cc11).

The fourth diagram shows waveforms of Vreset and Vset control voltages. In this sample, set and reset pulses are chosen to be of 15 μs duration. The pulsed setting source Vset starts after current has dropped to zero to achieve lowest losses.

Finally, the fifth or lowest diagram shows respective waveforms of voltage (V(I1)) and current (I(I1)) supplied to the string of laser diodes La1 to La10.

FIG. 5 shows similar waveforms of a performance using a constantly operating current source Is. For enhanced pulse shape and efficiency the control signals are somewhat increased to 10V.

When looking to the current pulses in the laser diodes La1 to La10 they are now completely determined by the control pulses. Due to the fact that the control signals do only reach the pixel circuit with the laser diodes La1 to La10 while it is close to ground potential, the set command is now delayed pixel by pixel. Delay timing depends on dimensioning of the circuit and can be chosen in a broad range.

FIG. 6 shows a time-extended version of the diagrams of FIG. 5 in the range from 177 μs to 207 μs, so that transition periods are enlarged.

An application of the above embodiments is enabling pixelated radiation sources (e.g. VCSELs or other laser diodes or LEDs or the like) with large number of separately pulsed pixels in a cost and wiring effective way. One exemplary application of such arrays is thermal printing and processing. A typical implementation for example needs 3000 pixels operated at 0.5 A/2V each. The configuration can then be like 50 VCSELs per string and 60 strings, still limiting voltages well below 120V for safety reasons, or exploiting the full isolation capabilities of the Laser assembly by using 100 pixels in series, resulting in only 30 strings of 200V.

While in the above embodiments reset signals are applied to all radiation elements at once, a modified implementation could also make use of serial data provided by a controller to start activation at the top radiation element. In that way part of the serial to pixel decoding becomes part of the power circuit.

In summary, a good way to avoid extreme current levels when supplying large amounts of power is to increase the voltage. The easiest way to do this is connecting the radiation elements (e.g. laser diode pixels) in series. In such a pixelated driver, the amount of components and complexity per pixel are reduced by connecting as many radiation elements as possible in series, supplying the string by one current controlled driver, shortening pixels which should be in off state by a switch in parallel to the radiation element, storing binary on/off information for each pixel locally, creating a floating supply for the switches, and managing information transfer to the floating storage and switches.

While the invention has been illustrated and described in detail in the drawings and the foregoing description, such illustration and description are to be considered illustrative or exemplary and not restrictive. The invention is not limited to the application of pixel arrays for thermal printing and processing. The proposed driving scheme can be used for any application of pixel rows in any illumination device and could as well be implemented on a software basis by controlling a processor of a computing device by at least one software program or routine so as to control switching operations at the radiation elements.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

The invention claimed is:

1. A circuit for driving an array of radiation elements, said circuit comprising:
   a plurality of switching elements connected in parallel to respective ones of said radiation elements and controllable to individually shorten said respective ones of said radiation elements;
   a plurality of local storage elements connected to respective ones of said switching elements and adapted to locally store a binary information which determines the switching state of the respective switching element; and
   a plurality of local floating supply elements for delivering a floating supply used to control respective ones of said switching elements in accordance with said binary information.

2. The circuit according to claim 1, wherein said local storage element and said local floating supply element are implemented by a capacitor.

3. The circuit according to claim 1, further comprising a local control terminal for controlling a first local circuit to set said binary information of a respective one of said plurality of local storage elements to a predetermined first state.

4. The circuit according to claim 3, wherein said first local circuit is adapted to supply said plurality of local floating supply elements in response to said local control terminal.

5. The circuit according to claim 3, wherein said circuit is adapted to supply control information to said local control terminal or common control terminal control terminal during pulse pauses of said array of radiation elements.

6. The circuit according to claim 5, wherein said pulse pauses are generated via a current supply.

7. The circuit according to claim 5, wherein said pulse pauses are generated via said common control terminal.

8. The circuit according to claim 5, further comprising a plurality of other local storage elements for storing binary information to be used for determining the switching state of the respective switching elements in a subsequent pulse.

9. The circuit according to claim 1, further comprising a common control terminal for controlling a second local circuit to reset said binary information of all local storage elements.

10. The circuit according to claim 1, wherein said switching elements comprise transistor elements.

11. An illumination device comprising a circuit according to claim 1, and said array of radiation elements.

12. The device according to claim 11, wherein said array of radiation elements comprises a string of radiation elements connected in series.

13. The device according to claim 12, further comprising a single current source for supplying current to said string of radiation elements.

14. A method for driving an array of radiation elements which are connected in series, said method comprising:
controlling respective ones of said radiation elements to individually shorten said respective ones of said radiation elements;
storing a binary information which determines the switching state of each of a plurality of switching elements connected in parallel to respective ones of said radiation elements so as to individually shorten said respective ones of said radiation elements; and
delivering a floating supply used to control respective ones of said switching elements in accordance with said binary information.

15. A computer program product comprising code means for producing the steps of method claim 14 when run on a computing device.

\* \* \* \* \*